United States Patent
Sato et al.

(10) Patent No.: US 7,810,772 B2
(45) Date of Patent: Oct. 12, 2010

(54) COLUMN SUCTION-HOLDING HEAD AND COLUMN MOUNTING METHOD

(75) Inventors: Isamu Sato, Souka (JP); Shinichi Nomoto, Hanyu (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 467 days.

(21) Appl. No.: 10/546,574

(22) PCT Filed: Nov. 4, 2004

(86) PCT No.: PCT/JP2004/016321

§ 371 (c)(1),
(2), (4) Date: Aug. 23, 2005

(87) PCT Pub. No.: WO2006/048931

PCT Pub. Date: May 11, 2006

(65) Prior Publication Data

US 2007/0039998 A1 Feb. 22, 2007

(51) Int. Cl.
*A47G 1/17* (2006.01)

(52) U.S. Cl. .................... 248/206.5; 248/363; 294/64.1

(58) Field of Classification Search ............... 294/64.1, 294/65; 248/206.5, 363; 228/49.5
See application file for complete search history.

(56) References Cited

U.S. PATENT DOCUMENTS

| | | | | |
|---|---|---|---|---|
| 5,261,157 A * | 11/1993 | Chang | .......................... | 29/844 |
| 5,749,614 A * | 5/1998 | Reid et al. | .................. | 294/64.1 |
| 5,762,258 A * | 6/1998 | Le Coz et al. | ............... | 228/56.3 |
| 6,102,459 A * | 8/2000 | Pabst et al. | ................. | 294/64.1 |
| 6,158,649 A * | 12/2000 | Miura | ......................... | 228/246 |
| 6,176,008 B1 * | 1/2001 | Ueoka | ......................... | 29/743 |
| 6,464,790 B1 * | 10/2002 | Sherstinsky et al. | ......... | 118/715 |
| 6,510,977 B1 * | 1/2003 | Hertz | .......................... | 228/246 |
| 6,513,802 B2 * | 2/2003 | Seger | .......................... | 269/21 |
| 7,293,354 B2 * | 11/2007 | Ferland et al. | ................ | 29/846 |
| 2003/0062734 A1 * | 4/2003 | Faris | .......................... | 294/64.1 |
| 2005/0196979 A1 * | 9/2005 | Fedde et al. | .................. | 439/66 |
| 2008/0188071 A1 * | 8/2008 | Lee et al. | .................... | 438/614 |

FOREIGN PATENT DOCUMENTS

| | | |
|---|---|---|
| JP | 2000-269400 | 9/2000 |
| JP | 2000-349220 | 12/2000 |
| JP | 2002-374061 | 12/2002 |

* cited by examiner

*Primary Examiner*—Amy J Sterling
(74) *Attorney, Agent, or Firm*—Wenderoth, Lind & Ponack, L.L.P.

(57) ABSTRACT

A column suction-holding head capable of inserting columns into all the holes of a mounting jig collectively at once. The body of the column suction-holding head has elongate holes at the same positions as those of electrodes installed on a ceramic substrate of a ceramic column grid array, and suction holes are provided at the bottoms of the elongate holes. The column suction-holding head is superimposed on an alignment jig having columns aligned therein, and suction is applied from the suction holes. Consequently, the columns in the alignment jig are sucked into the elongate holes of the column suction-holding head.

1 Claim, 5 Drawing Sheets

(A)

(D)

(E)

(F)

COLUMN SUCTION-HOLDING HEAD AND COLUMN MOUNTING METHOD

BACKGROUND OF THE INVENTION

1. Technical Field

The present invention relates to a method of mounting columns onto a ceramic column grid array substrate and also pertains to a column suction-holding head for use in the column mounting method.

2. Description of the Related Art

With the progress of technology to increase the communication speed of electronic devices and to integrate electronic components, there has been a tendency to fabricate multi-function electronic components with an increased number of leads (lead count). Examples of conventional electronic components with increased lead count include QFP, SOIC, etc. There has recently been a demand for electronic components with a further increased number of functions. Conventional multi-function electronic components are short of the number of leads needed to meet the demand. Under these circumstances, use has been made of ball grid arrays (hereinafter referred to as "BGA"), e.g. PBGA, CBGA, and TBGA, as electronic components with further increased lead count. However, BGA suffers from the disadvantage that the BGA substrate may be distorted by heat generated during the use of an electronic device incorporating the BGA substrate. In view of the problem of BGA substrate distortion, a type of grid array having columns in place of solder balls are used as connecting terminals, thereby further improving the ability to absorb thermal stress between substrates. This type of grid array is known as "ceramic column grid array" (hereinafter abbreviated as "CGA"). In CGA, a multiplicity of circular cylindrical columns are installed on a ceramic substrate to make an electric connection between the ceramic substrate and a printed substrate through the columns.

Columns used in CGA are high-temperature solder wires consisting essentially of lead, metal wires, solder-plated metal wires, etc. Various kinds of columns are used according to the size of CGA and the lead count thereof. Generally used columns have a diameter of 0.51 mm and a length of 2.54 mm. In CGA, columns are mounted on a ceramic substrate at right angles to the substrate surface because the ceramic substrate and the associated printed substrate have to be connected to each other accurately through the columns.

When columns are to be mounted on a ceramic substrate, a solder paste is applied to electrodes of the ceramic substrate, and the columns are placed on the solder paste coated portions of the ceramic substrate at right angles to the substrate surface. Thereafter, the solder paste is melted in a heating device such as a reflow furnace, thereby soldering the columns to the ceramic substrate. To mount the columns on the ceramic substrate perpendicularly to the substrate surface, a mounting jig is placed over the ceramic substrate, and the columns are inserted into respective holes of the jig. Thereafter, the ceramic substrate and the jig are heated in a reflow furnace. When a CGA loaded with columns is to be mounted on a printed substrate also, a solder paste is applied to the printed substrate, and the columns of the CGA are placed on the solder paste coated portions of the printed substrate. Thereafter, the solder paste is melted in a reflow furnace to solder the columns to the printed substrate.

In BGA, when solder balls are to be mounted on a BGA substrate, they can be mounted collectively onto all electrodes at once by using a suction-holding device or a mask. When a suction-holding device is used, solder balls are held by suction in a suction-holding jig having suction-holding holes at the same positions as those of electrodes on the BGA substrate. Then, the solder balls are released directly above the respective electrodes, thereby mounting the solder balls onto the electrodes. When a mask is used, one that has holes at the same positions as those of the electrodes is placed over the BGA substrate. Then, solder balls are rolled on the mask and inserted into the respective holes of the mask, thereby allowing the solder balls to be mounted onto the electrodes. In other words, when solder balls are mounted on the BOA substrate by holding the balls with the suction-holding jig or by inserting them into the holes of the mask, the solder balls can be mounted onto the electrodes without any problems, no matter which portion of a solder ball is held by suction in a hole of the jig or inserted into a hole of the mask, because the solder balls have no directional property.

Columns mounted on a CGA are of circular cylindrical shape. Therefore, the columns cannot be held easily with a suction-holding jig as in the case of solder balls. Moreover, if a CGA fails to be loaded with all of a large number of columns required, it cannot function as an electronic component. That is, the lack of even only one column results in a defective CGA.

The present inventors disclose a column alignment device having an alignment plate provided with the same number of elongate grooves as the number of electrodes at one side of a ceramic substrate of a CGA. Each groove has the same width as the electrode width. A cover member is placed on the alignment plate to remove columns anywhere other than the grooves. The alignment plate is installed on a rectilinear feeder. A column supply device is installed in the neighborhood of the alignment plate to supply columns onto the alignment plate. [see Japanese Patent Application Unexamined Publication (KOKAI) No. 2004-200280].

Further, the present inventors disclose a column suction-holding head provided with the same number of grooves as the number of electrodes in one row on a ceramic substrate of a ceramic column grid array. The grooves are arranged at the same pitch as the column mounting pitch on the ceramic substrate. Suction holes are bored in the grooves and connected to a vacuum device. [see Japanese Patent Application Unexamined Publication (KOKAI) No. 2004-221287]. The present inventors also disclose a column mounting jig having a heat-resisting plate provided with holes at the same positions as those of electrodes on a ceramic substrate of a CGA. The plate is formed with positioning portions that allow the hole positions to coincide with the corresponding electrodes of the ceramic substrate when the plate is placed over the ceramic substrate. The plate is further formed with spacer portions that allow a predetermined gap to be provided between the reverse side of the plate and the ceramic substrate. [see Japanese Patent Application Unexamined Publication (KOKAI) No. 2004-228125].

SUMMARY OF THE INVENTION

The conventional column mounting devices suffer, however, from the following problem. Columns need to be aligned in a predetermined direction for each row before being held by suction, and the aligned columns are inserted into the jig row-by-row. The technique disclosed in JP 2004-228125 takes much time to mount a large number of columns because the columns are aligned in a predetermined direction for each row before being held by suction and then inserted into the column mounting jig row-by-row.

Accordingly, an object of the present invention is to provide a column suction-holding head capable of collectively suction-holding the same number of columns as that of electrodes on a ceramic substrate of a CGA when columns are to be held in a suction-holding jig, and also provide a column mounting method using the column suction-holding head.

According to the conventional column mounting method, columns are aligned to extend horizontally and then suction-held for each row with a column suction-holding head to mount them onto a ceramic substrate. Therefore, the conventional method is disadvantageous in terms of productivity. The present inventors accomplished the present invention by noting that if columns have previously been aligned to extend vertically, the same number of columns as that of electrodes on a ceramic substrate can be collectively mounted thereon at once.

The present invention is a column suction-holding head characterized by having elongate holes capable of receiving columns that are provided at the same positions as those of electrodes on a ceramic substrate of a ceramic column grid array. The elongate holes have suction holes provided at the bottoms thereof. The suction holes have a smaller diameter than that of the elongate holes. The suction holes are in communication with a suction chamber. Moreover, a suction pipe communicating with the outside is installed in the suction chamber.

Another invention is a column mounting method characterized by including:

(A) a step of preparing an alignment jig having columns inserted in respective alignment holes at the same positions as those of electrodes on a ceramic substrate of a ceramic column grid array;

(B) a step of superimposing on the alignment jig a column suction-holding head having elongate holes at the same positions as those of the electrodes on the ceramic substrate of the ceramic column grid array, the elongate holes being capable of suction from their bottoms, so that the alignment holes of the alignment jig and the elongate holes coincide with each other;

(C) a step of applying suction from the bottoms of the elongate holes of the column suction-holding head to suck the columns inserted in the alignment holes of the alignment jig into the elongate holes of the column suction-holding head, thereby inserting the columns into the elongate holes;

(D) a step of separating the column suction-holding head having the columns inserted into all the elongate holes from the alignment jig;

(E) a step of placing the column suction-holding head having the columns loaded into all the elongate holes over a mounting jig placed over the ceramic substrate so that the elongate holes coincide with mounting holes of the mounting jig; and (F) a step of canceling the suction applied to the column suction-holding head to mount the columns onto the electrodes of the ceramic substrate.

According to the present invention, columns are suction-held with a column suction-holding head having the same number of elongate holes as that of electrodes on a ceramic substrate of a CGA. Therefore, the columns can be mounted onto all the electrodes of the ceramic substrate by a single operation. This is an advantageous effect not achievable with the conventional column mounting method or jig.

DETAILED DESCRIPTION OF THE INVENTION

The column suction-holding head according to the present invention is for suction-holding columns inserted in the alignment holes of the alignment jig. Therefore, the diameter of the elongate holes of the column suction-holding head needs to be slightly larger than the diameter of the columns. If the clearance between each elongate hole of the suction-holding head and a column inserted into the elongate hole is excessively small, it becomes difficult to suction-hold the column. If the clearance is excessively large, it becomes impossible to suction-hold the column vertically. Preferably, the diameter of the elongate holes is larger than the diameter of the columns by from 0.01 mm to 0.03 mm, more preferably, from 0.015 mm to 0.025 mm.

Regarding the depth of the elongate holes of the column suction-holding head, if the elongate hole depth is shorter than the overall length of the columns, it is easy to insert the columns into the mounting holes of the mounting jig. The elongate hole depth is preferably from 40 to 60%, more preferably from 45 to 55%, of the column overall length.

The column suction-holding head according to the present invention can suction-hold all the columns without a failure if the entrances of the elongate holes are tapered. The tapered entrances of the elongate holes can guide the columns effectively and allow them to be inserted into the elongate holes easily even if the columns are somewhat tilted. The tapered entrances of the elongate holes have a taper angle of 55 to 65 degrees, preferably, 60 degrees.

Figure 3:
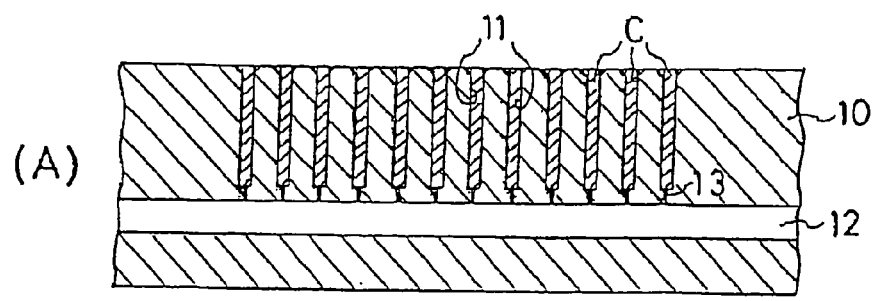
FIG. 3 A diagram illustrating an alignment jig having columns aligned in alignment holes.
Figure 4:
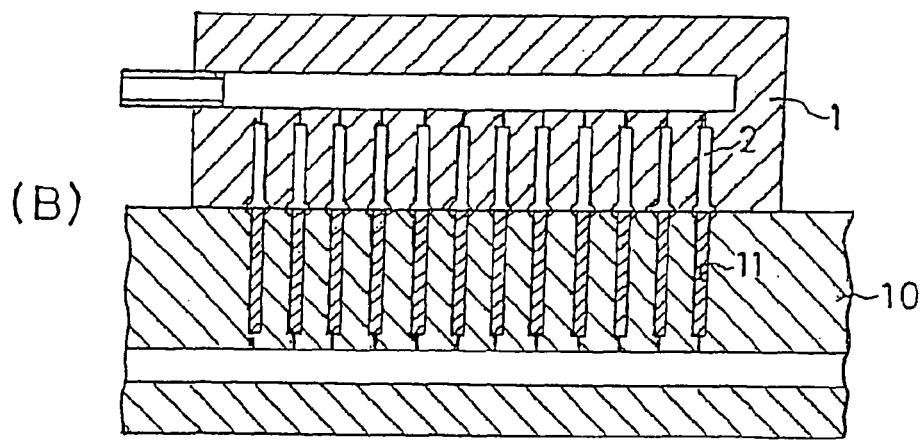
FIG. 4 A diagram illustrating how the column suction-holding head is superimposed on the alignment jig.
Figure 5:
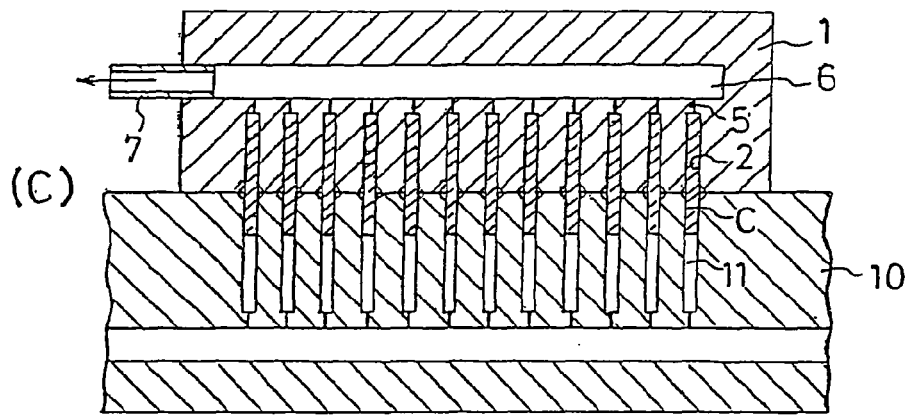
FIG. 5 A diagram illustrating how the columns are sucked into elongate holes of the column suction-holding head.
Figure 6:
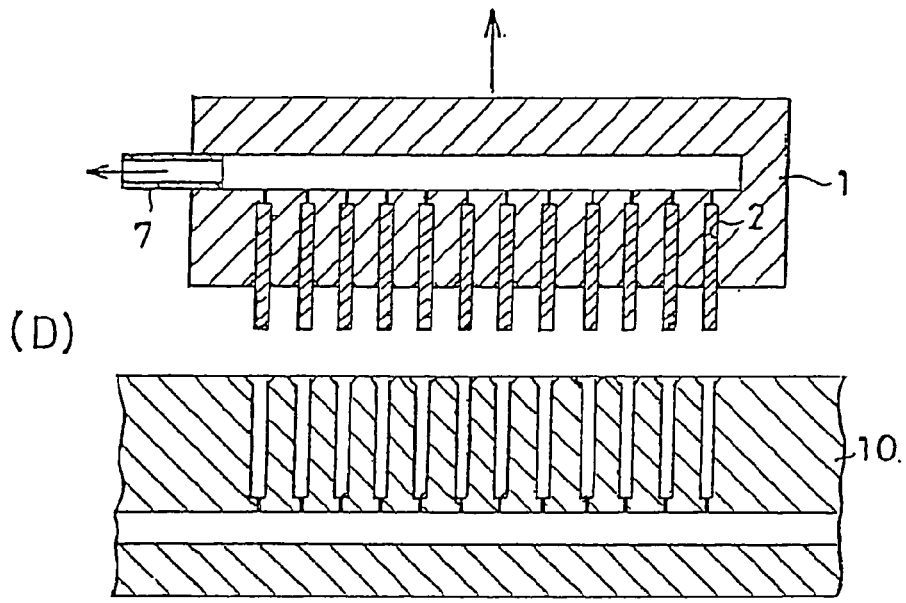
FIG. 6 A diagram illustrating how the column suction-holding head is separated from the alignment jig.
Figure 7:
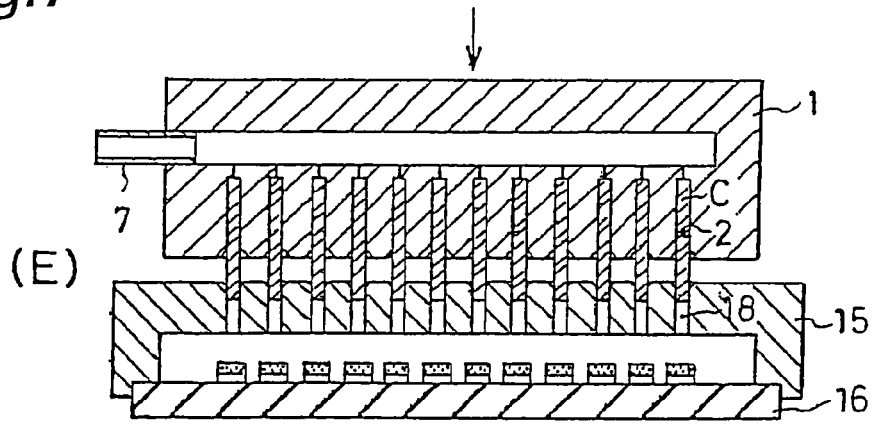
FIG. 7 A diagram illustrating how the columns are inserted into mounting holes of a mounting jig.
Figure 9:
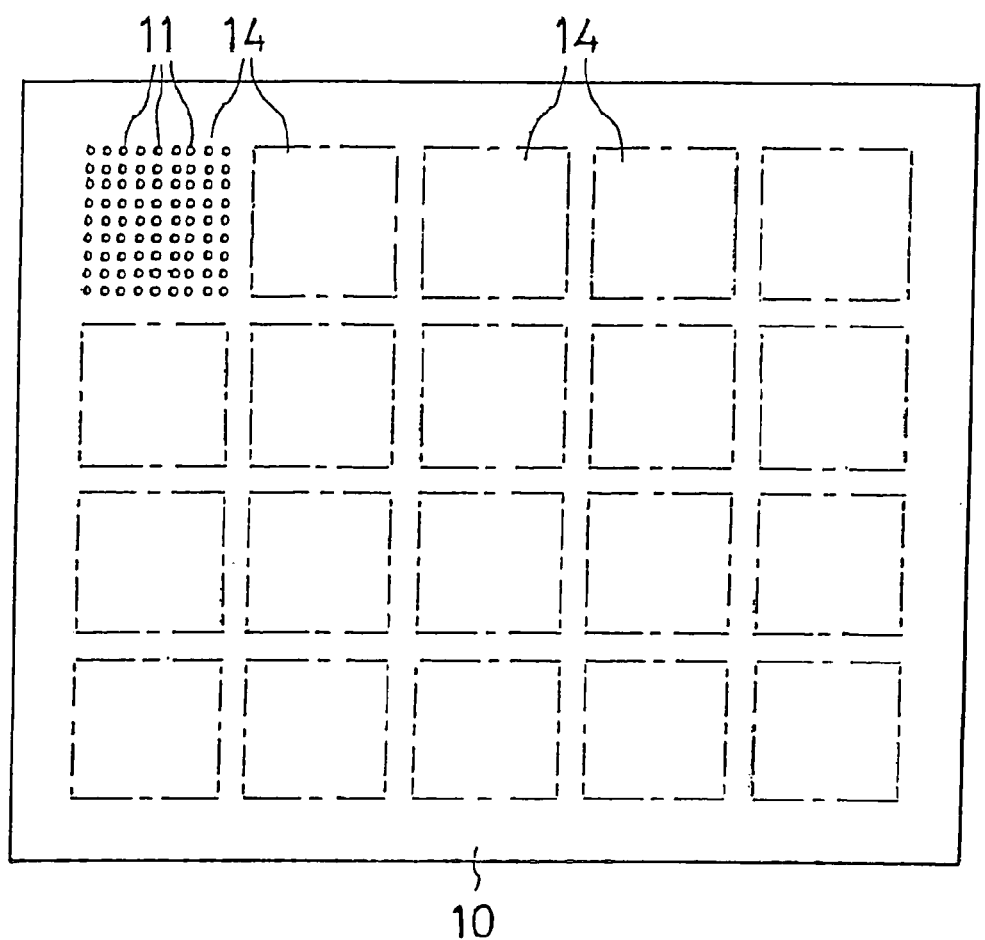
FIG. 9 A plan view of a column alignment jig used in a column mounting method according to the present invention.

The alignment jig used in the column mounting method according to the present invention will be explained with reference to FIG. 3. The alignment jig 10 has alignment holes 11 at the same positions as those of electrodes on a ceramic substrate of a CGA. The depth of the alignment holes 11 is approximately equal to the length of columns C. The bottoms of the alignment holes 11 are provided with suction holes 13 communicating with a suction chamber 12. With a view to increasing productivity, the alignment jig 10 is preferably formed with a multiplicity of units each corresponding to one CGA, for example, 20 units 14 for 20 CGAs, as shown in FIG. 9. A column alignment device (not shown) is used to insert columns into the alignment holes 11 of all the units 14 of the alignment jig 10. The column alignment device is capable of swinging the alignment jig 10 like a seesaw while applying vibrations thereto and of performing suction from the suction chamber 12 of the alignment jig 10. To insert columns into the alignment holes 11 of the alignment jig 10 by using the column alignment device, the alignment jig 10 is placed in the column alignment device, and a large number of columns are put on the alignment jig 10. Then, the alignment jig 10 is vibrated and swung by the column alignment device, and suction is performed from the suction chamber 12. Consequently, the columns placed on the alignment jig 10 are inserted into all the alignment holes 11.

The alignment jig 10 has units 14 provided for a multiplicity of CGAs. The column suction-holding head is superimposed on each unit 14 in precise coincidence therewith. For this purpose, the alignment jig 10 is placed on a precision X-Y table (not shown), and the X-Y table is moved accurately, thereby positioning the column suction-holding head directly above one unit 14 of the alignment jig 10. Thereafter, the column suction-holding head is lowered and superimposed on the alignment jig 10. The column suction-holding head as herein used is capable of moving up and down above the X-Y table and also capable of moving up and down above a mounting jig (described later) when the head is moved to directly above the mounting jig.

Figure 8:
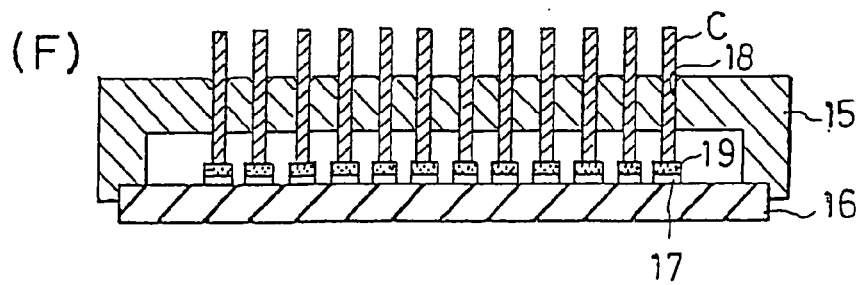
FIG. 8 A diagram illustrating how the columns are mounted onto a ceramic substrate.

In the column mounting method according to the present invention, after columns have been held with the suction-holding head, the columns are mounted onto a ceramic substrate. To mount the columns accurately onto the ceramic substrate, a mounting jig is needed. As shown in FIG. 8, the mounting jig 15 is structured to cover a ceramic substrate 16 with a spacing provided between itself and the ceramic substrate 16. The mounting jig 15 has mounting holes 18 provided on the obverse surface thereof at respective positions corresponding to electrodes 17 on the ceramic substrate 16. All the electrodes 17 of the ceramic substrate 16 are coated with a solder paste 19 in advance.

Figure 1:
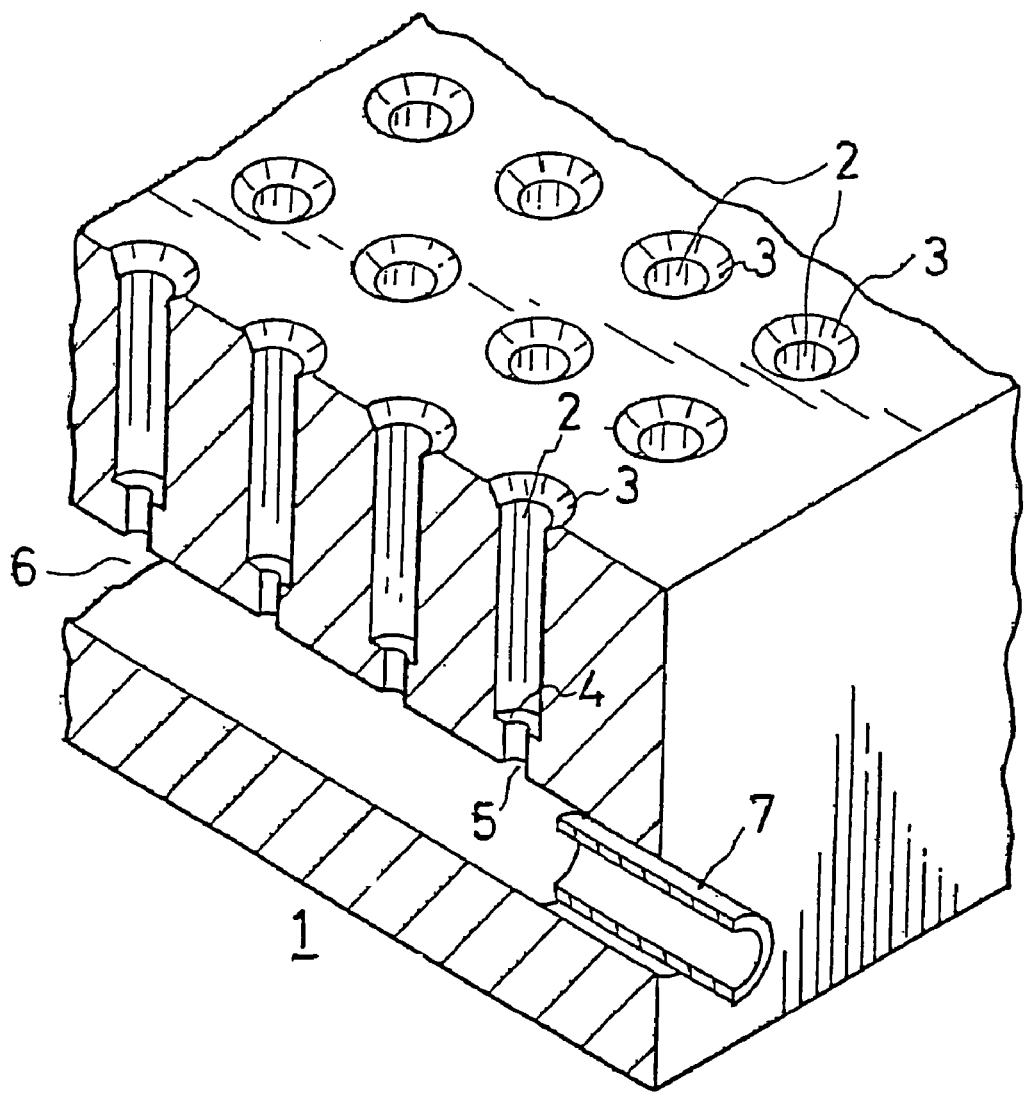
FIG. 1 A partly-sectioned enlarged perspective view of a column suction-holding head as turned upside down.
Figure 2:
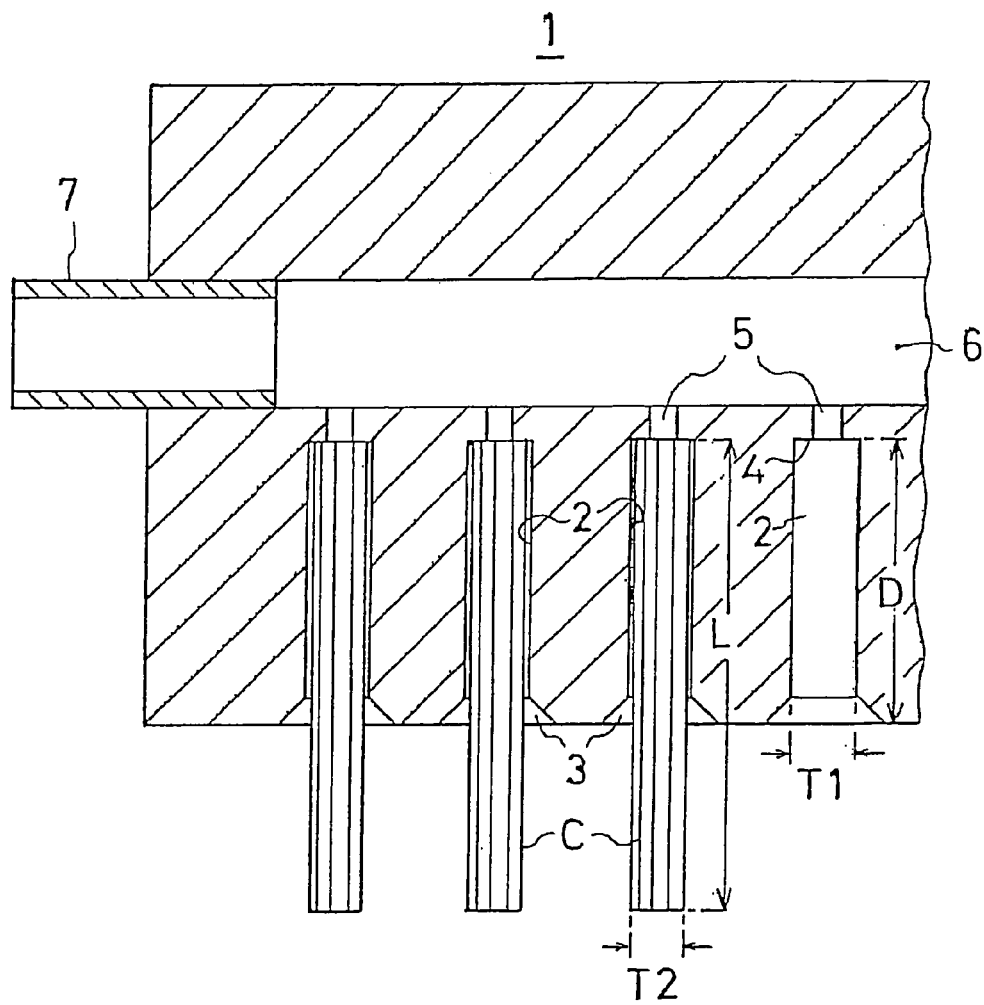
FIG. 2 A fragmentary enlarged sectional view of the column suction-holding head.

The column suction-holding head and column mounting method according to the present invention will be described below with reference to the accompanying drawings. FIG. 1 is a partly-sectioned enlarged perspective view of the column suction-holding head as turned upside down. FIG. 2 is a fragmentary enlarged sectional view of the column suction-holding head. FIGS. 3 to 8 are diagrams illustrating the steps of the column mounting method according to the present invention. FIG. 9 is a plan view of an alignment jig used in the column mounting method according to the present invention.

First, the column suction-holding head according to the present invention will be explained. The column suction-holding head 1 has elongate holes 2 bored at the same positions as those of electrodes installed on a ceramic substrate of a CGA (not shown). The depth D of the elongate holes 2 is shorter than the length L of columns C. The diameter T1 of the elongate holes 2 is slightly larger than the diameter T2 of the columns C to be held therein by suction, thereby allowing the columns C to enter and exit the elongate holes 2 easily. The entrances of the elongate holes 2 are tapered as indicated by reference numeral 3. The bottoms 4 of the elongate holes 2 are provided with suction holes 5 having a smaller diameter than that of the elongate holes 2. All the suction holes 5 are in communication with a suction chamber 6. Further, the column suction-holding head 1 has a suction pipe 7 inserted into the suction chamber 6 from a side of the body thereof. The end of the suction pipe 7 projecting out of the column suction-holding head 1 is connected to a suction device (not shown).

The following is an explanation of the column mounting method carried out by using the column suction-holding head having the above-described structure.

(A) Step of Preparing an Alignment Jig Having Columns Inserted in Alignment Holes (FIG. 3):

Columns C are inserted into the alignment holes 11 of the alignment jig 10 in advance. Insertion of columns C into the alignment jig 10 is carried out by using an alignment device as stated above. In this way, an alignment jig is prepared that has columns aligned to extend vertically in coincidence with electrodes on a ceramic substrate.

(B) Step of Superimposing the Column Suction-Holding Head on the Alignment Jig (FIG. 4):

The column suction-holding head 1 is superimposed on the alignment jig 10 so that the elongate holes 2 of the column suction-holding head 1 coincide with the alignment holes 11 of the alignment jig 10.

(C) Step of Sucking the Columns into the Elongate Holes of the Column Suction-Holding Head (FIG. 5):

In a state where the column suction-holding head 1 is superimposed on the alignment jig 10, the air in the suction chamber 6 is sucked from the suction pipe 7 (as indicated by the arrow). This causes the air in the elongate holes 2 to be sucked from the suction holes 5 communicating with the suction chamber 6. Consequently, the columns C inserted in the alignment holes 11 of the alignment jig 10 that are coincident with the elongate holes 2 are sucked into the elongate holes 2 of the column suction-holding head 1.

(D) Step of Separating the Column Suction-Holding Head From the Alignment Jig (FIG. 6):

After the columns C have been sucked into all the elongate holes 2 thereof, the column suction-holding head 1 is moved upward to separate from the alignment jig 10.

(E) Step of Inserting the Columns into the Mounting Holes of the Mounting Jig (FIG. 7):

The column suction-holding head 1 having the columns C sucked into the elongate holes 2 is moved to directly above the mounting jig 15 by a moving device (not shown). Thereafter, the column suction-holding head 1 is moved downward. At this time, the columns C are slightly projecting from the column suction-holding head 1. Therefore, the projecting portions of the columns C are inserted into the mounting holes 18 of the mounting jig 15.

(F) Step of Mounting the Columns onto the Ceramic Substrate of the CGA:

When the suction applied to the column suction-holding head 1 from the suction pipe 7 is canceled, the columns C inserted in the mounting holes 18 drop due to gravity and are mounted onto the ceramic substrate 16 from the mounting holes 18 of the mounting jig 15 placed over the ceramic substrate 16. If compressed air is sent from the suction pipe 7, the columns C in the elongate holes 2 are pushed out by the compressed air, thereby allowing the columns C to drop even more reliably. The electrodes 17 of the ceramic substrate 16 have previously been coated with a solder paste 19. Therefore, if the ceramic substrate 16 loaded with the columns C is heated in a heating device such as a reflow furnace, the solder paste 19 is melted to solder the columns C and the electrodes 17 to each other.

As has been stated above, the column suction-holding head according to the present invention allows columns to be surely inserted into all the grooves of the column suction-holding head from the alignment device. Therefore, the columns held by the suction-holding head can be completely inserted into the holes of the mounting jig. Accordingly, if the column suction-holding head of the present invention is used to mount columns onto a ceramic substrate, a defect-free CGA can be produced with high reliability.

EXPLANATION OF REFERENCE NUMERALS

1 Column suction-holding head
2 Elongate hole
3 Tapered entrance
4 Bottom of elongate hole
5 Suction hole
6 Suction chamber
7 Suction pipe

The invention claimed is:

1. A column mounting method comprising:

preparing an alignment jig having columns inserted in respective alignment holes at the same positions as those of electrodes on a ceramic substrate of a ceramic column grid array;

superimposing, on the prepared alignment jig, a column suction-holding head having elongate holes at the same positions as those of the electrodes on the ceramic substrate of the ceramic column grid array, the elongate holes being capable of suction from their bottoms, so that the alignment holes of the alignment jig and the elongate holes coincide with each other;

applying suction from the bottom of the elongate holes of the column suction-holding head to suck the columns inserted in the alignment holes of the alignment jig into the elongate holes of the column suction-holding head, thereby inserting the columns into the elongate holes;

separating the column suction-holding head having the columns inserted into all of the elongate holes from the alignment jig;

placing the column suction-holding head having the columns loaded into all of the elongate holes over a mounting jig placed over the ceramic substrate so that the elongate holes coincide with mounting holes of the mounting jig; and canceling the suction applied to the column suction-holding head to mount the columns onto the electrodes of the ceramic substrate.

* * * * *